United States Patent [19]
Cole, Jr. et al.

[11] Patent Number: 5,781,017
[45] Date of Patent: Jul. 14, 1998

[54] CAPACITIVE CHARGE GENERATION APPARATUS AND METHOD FOR TESTING CIRCUITS

[75] Inventors: Edward I. Cole, Jr.; Kenneth A. Peterson; Daniel L. Barton, all of Albuquerque, N. Mex.

[73] Assignee: Sandia Corporation, Albuquerque, N. Mex.

[21] Appl. No.: 638,519

[22] Filed: Apr. 26, 1996

[51] Int. Cl.$^6$ ........................................... G01R 31/302
[52] U.S. Cl. ................................. 324/751; 324/501
[58] Field of Search .......................... 324/751, 501, 324/750, 500; 250/310

[56] References Cited

U.S. PATENT DOCUMENTS

| | | | |
|---|---|---|---|
| 4,415,851 | 11/1983 | Langner | 324/51 |
| 4,417,203 | 11/1983 | Pfeiffer | 324/51 |
| 4,443,278 | 4/1984 | Zingher | 156/64 |
| 4,578,279 | 3/1986 | Zingher | 427/10 |
| 4,712,057 | 12/1987 | Pau | 324/73 R |
| 4,843,330 | 6/1989 | Golladay | 324/158 R |
| 5,053,699 | 10/1991 | Aton | 324/158 R |
| 5,138,266 | 8/1992 | Stearns | 324/537 |
| 5,404,110 | 4/1995 | Golladay | 324/751 |
| 5,523,694 | 6/1996 | Cole | 324/751 |

OTHER PUBLICATIONS

E. I. Cole, Jr., C. R. Bagnell, Jr., B. G. Davies, A. M. Neacsu, W. V. Oxford, and R. H. Propst, "Advanced Scanning Electron Microscopy Methods and Applications to Integrated Circuit Failure Analysis," *Scanning Microscopy*, vol. 2, pp. 133–150, 1988, (month unavailable).

W. Reiners, K. D. Herrmann, and E. Kubalek, "Electron Beam Testing of Passivated Devices, via Capacitive Coupling Voltage Contrast," *Scanning Microscopy*, vol. 2, pp. 161–175, 1988, (month unavailable).

J. I. Goldstein, D. E. Newbury, P. Echlin, D. C. Joy, A. D. Romig, Jr., C. E. Lyman, C. Fiori, and E. Lifshin, *Scanning Electron Microscopy and X-Ray Microanalysis*, (Plenum Press, New York, 1992) pp. 107–111 and 249–255, 1992, (month unavailable).

E. I. Cole, Jr. and R. E. Anderson, "Rapid Localization of IC Open Conductors using Charge–Induced Voltage Alteration (CIVA)," in *30th Annual Proceedings Reliability Physics 1992* (IEEE, Piscataway, NJ, 1992), pp. 288–298, 1992, (month unavailable).

L. Reimer, *Image Formation in Low–Voltage Scanning Electron Microscopy*, (SPIE Optical Engineering Press, Bellingham, WA, 1993), pp. 71–88, 1993, (month unavailable).

(List continued on next page.)

*Primary Examiner*—Ernest F. Karlsen
*Attorney, Agent, or Firm*—John P. Hohimer

[57] ABSTRACT

An electron beam apparatus and method for testing a circuit. The electron beam apparatus comprises an electron beam incident on an outer surface of an insulating layer overlying one or more electrical conductors of the circuit for generating a time varying or alternating current electrical potential on the surface; and a measurement unit connected to the circuit for measuring an electrical signal capacitively coupled to the electrical conductors to identify and map a conduction state of each of the electrical conductors, with or without an electrical bias signal being applied to the circuit. The electron beam apparatus can further include a secondary electron detector for forming a secondary electron image for registration with a map of the conduction state of the electrical conductors. The apparatus and method are useful for failure analysis or qualification testing to determine the presence of any open-circuits or short-circuits, and to verify the continuity or integrity of electrical conductors buried below an insulating layer thickness of 1–100 μm or more without damaging or breaking down the insulating layer. The types of electrical circuits that can be tested include integrated circuits, multi-chip modules, printed circuit boards and flexible printed circuits.

28 Claims, 6 Drawing Sheets

OTHER PUBLICATIONS

J. M. Soden and R. E. Anderson, "IC Failure Analysis: Techniques and Tools for Quality and Reliability Improvement," *Proceedings of the IEEE*, vol. 81, pp. 703–715, May 1993.

E. I. Cole, Jr., J. M. Soden, B. A. Dodd, and C. L. Henderson, "Low Electron Beam Energy CIVA Analysis of Passivated ICs," in *Proceedings of the International Symposium for Testing and Failure Analysis*, pp. 23–32, Nov., 1994.

CAPACITIVE CHARGE GENERATION APPARATUS AND METHOD FOR TESTING CIRCUITS

This invention was made with Government support under Contract No. DE-AC0494AL85000 awarded by the U.S. Department of Energy. The Government has certain rights in the invention.

FIELD OF THE INVENTION

The present invention relates generally to testing and failure analysis methods using an electron beam, and more particularly to an electron beam apparatus and method for identifying and mapping a conduction state of one or more electrical conductors located beneath an insulating layer in a circuit such as an integrated circuit, a multi-chip module, a printed-circuit board, a flexible printed circuit or the like.

BACKGROUND OF THE INVENTION

The development of multi-chip modules (MCMs) presents many new challenges and opportunities for failure analysis, not only in the analysis and location of defects within a plurality of integrated circuits (ICs) forming the MCMs, but also in the analysis and location of defects within electrical interconnections formed between the individual ICs. Failure analysis of MCM interconnections can be complicated by the use of relatively thick ($\geq 10$ µm) insulating layers to isolate multiple layers of patterned interconnections. The majority of prior-art failure analysis methods are generally not applicable to testing of circuits having patterned electrical conductors below an insulating layer having a thickness of greater than one micron. Other prior-art methods such as resistive contrast imaging (RCI) or charge-induced voltage alteration (CIVA) that rely on an electrical breakdown of an insulating layer to localize open-circuit conductors can penetrate through up to about 10 µm of silicon dioxide ($SiO_2$) or silicon nitride ($Si_3N_4$); but this requires a very high electron beam energy of about 40,000 electron volts (eV) and is damaging to the insulating layer and possibly to circuit elements (e.g. transistors) therebelow.

An advantage of the electron beam apparatus and method of the present invention is that limitations of the prior art are overcome to allow testing, identification, and imaging or mapping of a conduction state (e.g. an open-circuit state, a short-circuit state, or a continuity state) of one or more electrical conductors within a circuit that are located beneath one or more insulating layers.

Further advantages are that the electron beam apparatus and method of the present invention does not produce electrical breakdown of the insulating layer(s) overlying and/or separating a plurality of electrical conductors; and that conduction states can be measured for electrical conductors beneath one or more insulating layers having a total thickness from about 1 µm to 100 µm or more, depending on particular dielectric materials used for forming the insulating layers.

Another advantage is that a conduction state of one or more electrical conductors in a circuit can be measured with the electron beam apparatus and method of the present invention even when no electrical bias signal is applied to the conductors.

Yet a further advantage of the present invention is that the electron beam apparatus and method can be used for testing of many different types of circuits having one or more conductors located below or adjacent to an insulating layer, including integrated circuits, multi-chip modules, printed-circuit boards, flexible printed circuits or the like.

These and other advantages of the electron beam apparatus and method of the present invention will become evident to those skilled in the art.

SUMMARY OF THE INVENTION

The electron beam apparatus and method are provided for testing a circuit to determine a conduction state of at least one electrical conductor therein. The apparatus comprises an electron beam incident on an outer surface of an insulating layer overlying (or adjacent to) the electrical conductor for generating an electrical potential thereon; and current or voltage measuring circuitry connected to the electrical conductor for measuring an electrical signal capacitively coupled to the electrical conductor in response to the electrical potential. The electron beam apparatus can further include a stage for holding the circuit and making at least one electrical connection thereto; and means for scanning the electron beam over the outer surface of the insulating layer to form an image or map of the conduction state of one or more electrical conductors within the circuit. The electron beam is preferably focused to a spot size that is about a lateral dimension of the electrical conductor or smaller, with a relatively high electron beam current of about 25 nanoamperes or more, and with an energy that is sufficiently low (e.g. in the range of about 100 to about 5,000 electron volts) to prevent electrical breakdown of the insulating layer. Embodiments of the present invention can be used for testing or failure analysis of many different types of electrical circuits, including integrated circuits, multi-chip modules, printed-circuit boards and flexible printed circuits.

Other advantages and novel features of the invention will become apparent from the following detailed description thereof when considered in conjunction with the accompanying drawings.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
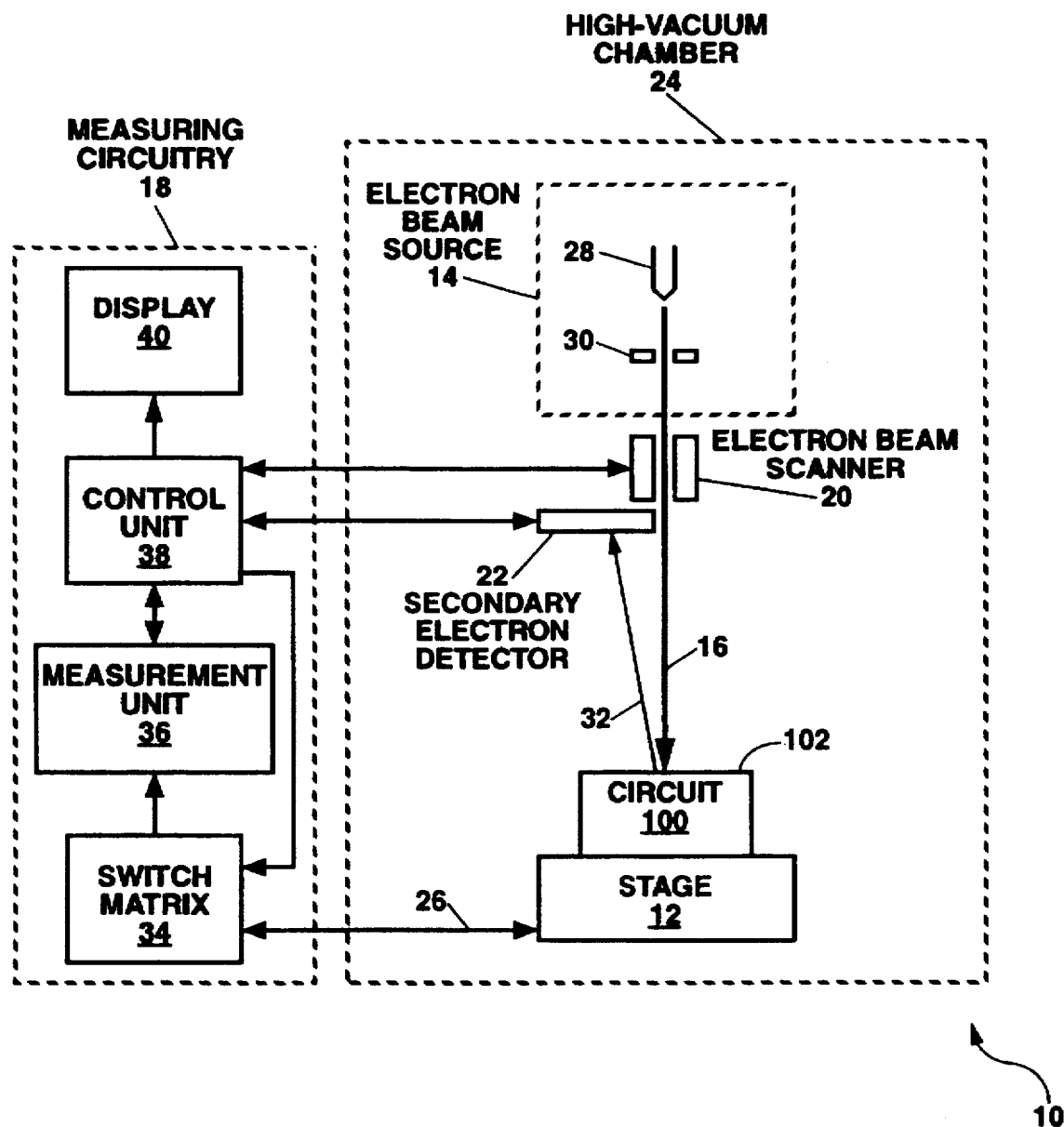
FIG. 1 shows a schematic diagram of the electron beam apparatus according to the present invention.

Referring to FIG. 1, there is shown a schematic diagram of an electron beam apparatus according to the present invention for testing a circuit to determine a conduction state of at least one electrical conductor therein. The apparatus 10 according to one embodiment of the present invention comprises a stage 12 for holding a circuit 100 and making one or more electrical connections thereto; an electron source 14 for providing an electron beam 16 incident on an outer surface 102 of the circuit 100 for generating an electrical potential thereon. (See FIG. 2 for a schematic drawing of a simplified example of the circuit 100 identifying elements thereof.) The apparatus 10 further comprises current or voltage measuring circuitry 18 connected to the circuit 100 for measuring an electrical signal capacitively coupled through an insulating layer 104 therein to one or more buried electrical conductors 106 in response to the electrical potential generated at the outer surface 102 of the circuit 100.

In order to test or analyze a plurality of patterned electrical conductors 106 within an electrical circuit 100, an beam scanner 20 is generally provided in the apparatus 10 for scanning the electron beam 16 over a predetermined portion of the outer surface 102 of the insulating layer 104 adjacent to one or more electrical conductors 106. The apparatus 10 according to certain preferred embodiments of the present invention can also include a secondary electron detector 22 for generating a secondary electron image (e.g. a topographic image) of the circuit 100. A high-vacuum chamber 24 (including a pump for creating a vacuum therein) is also preferably provided for containing one or more circuits 100 to be tested together with elements of the present invention including the stage 12, the source 14, the electron beam scanner 20, and the secondary electron detector 22. The chamber 24 may further include a load-lock or the like for providing for a rapid insertion and removal of the circuits 100 for testing and analysis thereof.

In FIG. 1, the stage 12 holds one or more circuits 100 to be tested or analyzed. The types of circuits 100 that can be tested with the electron beam apparatus 10 of the present invention include integrated circuits (ICs), multi-chip modules (MCMs), printed-circuit boards, flexible printed circuits or the like. The apparatus 10 can be applied to any type of electrical circuit comprising one or more electrical conductors 106 buried, at least in part, below one or more insulating layers 104 having an overall thickness in the range of about 1–100 μm.

Figure 2:
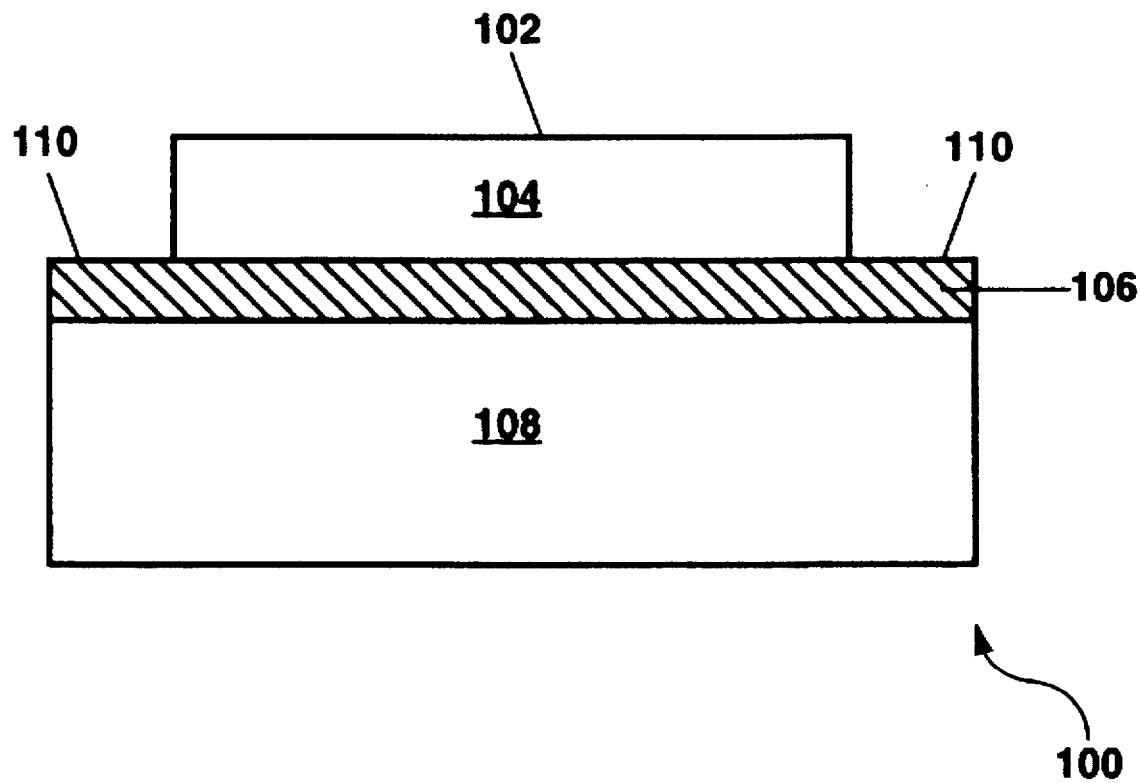
FIG. 2 shows a schematic cross-section view of a simplified example of a circuit which can be tested with the apparatus of the present invention.

A simplified example of an electrical circuit 100 to be tested with the electron beam apparatus of the present invention is shown schematically in cross-section view in FIG. 2. The circuit 100 in this example comprises an insulating layer 104 at least partially overlying one or more electrical conductors 106 formed on a substrate 108. The insulating layer 104 can comprise any dielectric material known to the art for insulating or passivating electrical conductors, including silicon dioxide, silicon nitride, glass (e.g. deposited or spun on), polymer, resin, ceramic and combinations thereof. The electrical conductors 106 in FIG. 2 are patterned to provide conduction paths to or between a plurality of elements formed on a device side of the substrate 108 or external thereto. Portions 110 of the electrical conductors 106 (e.g. bond or contact pads) in the example of FIG. 2 can be exposed for making external electrical connections to or from the conductors 106. For other examples of circuits 100, a plurality of layers of patterned electrical conductors 106 may be provided separated by insulating layers 104, with a last-formed insulating layer 104 overlying at least a part of a last-formed layer of electrical conductors 106.

In the case of integrated circuits (ICs) 100, the substrate 108 is generally a semiconductor with a plurality of devices (e.g. transistors, diodes, resistors etc.) formed on a device surface thereof, with the electrical conductors 106 providing interconnections between the various devices. In this case, the electrical conductors 106 are generally provided as one or more layers of a patterned thin-film metallization separated from each other and from the substrate 108 by insulating layers 104 (up to about 1 μm thick). The metallization layers are generally protected by a last-formed insulating layer 104 (e.g. a passivation layer) blanketing the last-formed metallization layer, except for a plurality of exposed bond pads. According to the present invention, such ICs 100 can be tested in many different forms, including a wafer form comprising a plurality of ICs 100 on a semiconductor wafer; a die form comprising a single IC 100 removed from a wafer for later mounting in a package, module, or the like; and a packaged form comprising one or more die affixed to a carrier or heatsink with or without encapsulation. Some types of encapsulated ICs 100 can also be tested with the electron beam apparatus 10 of the present invention, especially when an encapsulant or a wall of the package adjacent to the electrical conductors 106 has a total insulating layer thickness above the conductors 106 that is on the order of about 100 μm or less. In some instances, the encapsulant or package wall can be thinned for analysis with the electron beam apparatus 10 of the present invention.

Multi-chip modules (MCMs) are circuits 100 formed from a plurality of interconnected ICs provided on a common carrier or heatsink. One or more metallization layers are provided to form electrical connections 106 between the ICs forming the MCM circuit 100, with adjacent metallization layers being separated by an intervening insulating layer 104. A last-formed metallization layer of the MCM 100 is either exposed or protected, at least in part, by a last-formed insulating layer 104, depending on particular packaging requirements. If the last-formed metallization layer is completely exposed, the electron beam apparatus 10 can be used to provide an electrical charge directly to the exposed conductors for generating an electrical signal therein that can be detected. However, the electron beam apparatus 10 is especially advantageous for testing an MCM circuit 100 having one or more electrical conductors 106 at least partially buried below at least one insulating layer 104 formed of a dielectric material (e.g. a polymer film or silicon dioxide) with a layer thickness, for example, of about 1–30 μm. In this case, the apparatus 10 can generate a capacitively-coupled electrical signal in the buried electrical conductors 106 for detection to determine a conduction state of the electrical conductors 106.

The electron beam apparatus 10 of the present invention is also applicable to circuits in the form of printed-circuit boards or flexible printed circuits. Printed-circuit boards 100 are often completely overcoated for protection with an insulating layer 104 (e.g. a polymer layer) except for exposed solder joints, bond pads, contact pads and the like; and electrical components or devices connected thereto. Flexible printed circuits 100 can be formed by providing a plurality of electrical conductors 106 in the form of one or more patterned thin-film metallization layers sandwiched between a pair of insulating layers 104, with the conductors 106 generally exposed at contact points on one or more sides or ends of the flexible printed circuit 100, or at locations where electrical components are soldered to the electrical conductors 106.

Testing of printed-circuit boards and flexible printed circuits can be complicated by small feature sizes, and by the use of multiple overlapping patterned metallization layers. The present invention provides a method for testing of such circuits to determine the presence of any open-circuit or short-circuit conduction states therein, or to verify a continuity state or integrity of one or more electrical conductors 106. Furthermore, such testing can be performed either with electrical power (e.g. a bias signal) being applied to the circuit 100, or in the absence of any electrical power.

In FIG. 1, the circuit 100 can be mounted on a stage 12, with the stage providing one or more electrical connections 26 between the circuit 100 and the current or voltage measuring circuitry 18. The electrical connections 26 can include one or more sockets, probes, clips or the like that are configurable or moveable for connection to bond pads or probe points within the circuit 100. The electrical connections 26 can further penetrate the high-vacuum chamber 24 (e.g. by one or more electrical feedthroughs) for connection to the measuring circuitry 18 which is generally located outside the high-vacuum chamber 24. The stage 12 can also provide for a positioning the circuit in directions perpendicular to an incident electron beam 16, or for orienting the circuit 100 at an angle with respect to the incident beam 16.

The electron beam 16 is generated by an electron beam source 14 having an electron source 28 (e.g. a field-emission tip or a heated filament) and one or more grids, electrodes or focusing lenses (not shown) for accelerating the electrons and forming the electron beam 16. The electron beam source 14 provides an electron beam 16 having a predetermined energy which is generally in the range of about 100 eV to about 5,000 electron volts (eV) or more, with the electron beam energy preferably being sufficiently low to prevent electrical breakdown of any insulating layer 104 within the circuit 100 being tested. The electron beam energy to be used is generally about 300–1,000 eV when the thickness of the insulating layer 104 is less than about 10 µm, and up to about 5,000 eV or more when the thickness of the insulating layer 104 exceeds 10 µm. The exact electron beam energy required for a particular circuit can be learned from practice of the present invention.

The electron beam 16 further has an electron beam current or flux which is relatively high, being in a range from about 25 nanoamperes (nA) to about 200 nA or more, and preferably about 100–200 nA. To provide such a large electron beam current, the focusing lens can be set to provide a maximum electron beam spot size; and a current-limiting aperture 30 within the electron beam source 14 can either be opened, or otherwise removed completely. In this way, the electron beam spot size can be increased, for example, to about 0.5 µm to provide up to 200 nA electron beam current while still providing a focused spot size that is smaller than a lateral dimension of most electrical conductors 106 of circuits 100 to be tested by the apparatus 10.

In FIG. 1, the electron beam 16 incident on the outer surface 102 of the insulating layer 104 in the circuit 100 produces a bound or localized electrical charge, thereby generating an electrical potential, V, at or very near the surface 102. At the relatively high electron beam currents used for practice of the present invention, the electrical potential is dependent both on the electron flux (i.e. the electron beam current) and also on the time for which the electron beam 16 irradiates a particular portion of the outer surface 102 (i.e. on a rate at which the electron beam is scanned over the outer surface 102).

The electrical potential (also termed a surface potential) can be either positive or negative, depending primarily on the energy of the incident electron beam 16. In FIG. 1, the electron beam 16 irradiating the outer surface 102 of the insulating layer 104 produces both backscattered electrons (not shown) and secondary electrons 32. The secondary electrons 32 generally have a low energy in the range of about 2–5 eV, and are emitted at a rate that depends on the energy of the incident electron beam 16. This is due to a varying penetration depth in the dielectric material forming the insulating layer 104 with the energy of the electron beam 16; and it is further due to the low energy of the secondary electrons 32 which permits only those secondary electrons 32 generated within a few nanometers of the outer surface 102 to escape from the insulating layer 104.

At an electron beam energy greater than a certain value (e.g. about 1,000–4,000 eV) denoted $E_2$, which is dependent on a particular dielectric material used for forming the insulating layer 104, more electrons are provided to the outer surface 102 by the incident electron beam 16 than can escape from the surface 102 either as secondary electrons 32 or as backscattered electrons. This results in a negative charging of the outer surface 102 in the vicinity of the incident electron beam 16, and the generation of a negative electrical potential of a few volts at the surface 102. However, as the electron beam energy is reduced to a value below $E_2$, the rate of emission of secondary electrons 32 increases significantly, thereby completely reversing the sign of the charge at the outer surface 102 and generating a positive electrical potential there. This positive charging behavior persists for incident electron beam energies down to a certain value denoted $E_1$ (generally about 100 eV) below which the outer surface 102 is again negatively charged, producing a negative electrical potential.

When the incident electron beam is removed from an irradiated portion of the outer surface 102, the outer surface 102 quickly returns to an equilibrium condition by retaining or emitting additional secondary electrons 32. For the electron beam energy range between $E_1$ and $E_2$, under normal conditions (i.e. for an electron beam current <25 nA) a positive electrical potential is produced with an equilibrium value of the potential reached after a time period that depends inversely on the flux of the incident electron beam 16. However, at relatively high electron beam currents exceeding about b 25nA, the electrical potential can become negative in the energy range between $E_1$ and $E_2$. This unexpected behavior is thought to be due to a saturation in an ability of the outer surface 102 to produce additional secondary electrons 32 as the flux of incident electrons is increased. For example, a 1,000 eV incident electron beam 16 penetrates below the outer surface 102 to a depth of only about 50 nm or less, thereby providing a very small volume for possible emission of secondary electrons 32, with the secondary electron emission saturating at a relatively high electron beam current of ≧25 nA.

The negative electrical potential at a relatively high electron beam current (≧25 nA) and a low electron beam energy (in the range between $E_1$ and $E_2$) provides a means for producing a rapidly varying electrical potential that alternates between positive and negative values (i.e. an alternating current or ac electrical potential) as the electron beam 16 is scanned over the outer surface 102 of the circuit 100. This can be understood with the aid of FIG. 3 which illustrates a spatial profile of an electron beam 16 having a radial variation (e.g. a Gaussian beam profile) in a current density (i.e. the current or flux per unit area) that is symmetric about a center of the beam.

Figure 3:
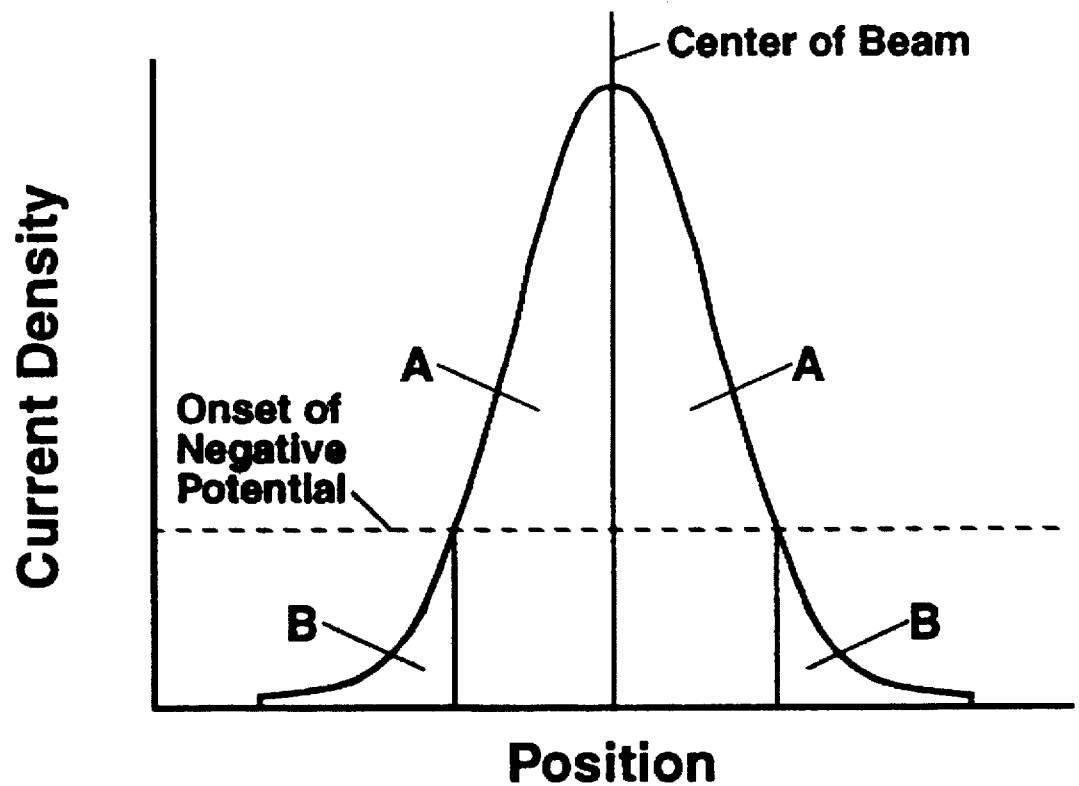
FIG. 3 shows a spatial profile of an electron beam in the apparatus of the present invention, with different regions of the beam indicated that generate either a negative or positive electrical potential on an outer surface of a circuit irradiated by the electron beam.

In a central region of the electron beam labelled "A" in FIG. 3 incident on the outer surface 102, the current density is above a predetermined value (indicated by a dashed horizontal line labelled "onset of negative potential") for which a negative charge is accumulated on the outer surface 102, producing a negative electrical potential thereon. For outer regions of the electron beam labelled "B" in FIG. 3 incident on the outer surface 102, the current density is below the predetermined value, resulting in a positive charge accumulation and a positive electrical potential on the outer surface 102. Thus, as the electron beam 16 is scanned over a particular portion of the outer surface 102, that portion can experience an alternating electrical potential that varies between positive and negative voltages depending on which region "A" or "B" of the electron beam is incident upon that portion of the outer surface at any instant of time. Such a change from negative to positive electrical potentials during a scan of the electron beam over the particular portion of the outer surface 102 occurs quickly since the current density is still substantial in the regions "B" due to the relatively high value of the electron beam current ($\geq 25$ nA). An exact value or magnitude of the ac electrical potential, V, will depend on predetermined values of the electron beam current density and the electron beam scan rate (which also depends on an area of the circuit 100 to be scanned), with higher current densities and/or faster scan rates generating a larger rate of change, $\partial V/\partial t$, of the electrical potential with time.

The ac electrical potential generated at the outer surface 102 of the insulating layer 104 polarizes the dielectric material therein producing a capacitively-coupled time-variant electrical charge at an interface between the insulating layer 104 and any underlying electrical conductor 106. Thus, according to the present invention, an electrical signal is generated within the conductor 106 by capacitive coupling of the ac electrical potential produced on the outer surface 102 by the incident electron beam 16, with the magnitude of the generated electrical signal depending among other things on the rate at which the electron beam 16 is scanned over the outer surface 102 of the circuit 100. Since, the electrical signal is generated in response to the incident electron beam 16, the electrical conductor 106 can be either biased with an electrical bias signal (e.g. for powering the circuit 100), or operated in an unbiased condition without any bias signal applied thereto. In either case, the generated electrical signal can be measured to identify and/or map a conduction state of one or more electrical conductors 106 in the circuit 100.

The generated electrical signal can be in the form of a current signal, I, produced by the capacitively-coupled ac electrical potential, V, or as a voltage signal produced by the current signal flowing through one or more elements within the circuit 100 (e.g. transistors or resistors) or connected thereto. The current signal, I, is related to the rate of change, $\partial V/\partial t$, of the electrical potential with time by:

$$I = C_0 \frac{\partial V}{\partial t}$$

where $C_0$ is a capacitance between the portion of the outer surface 102 irradiated by the electron beam 16 and the underlying electrical conductor 106. If the electron beam 16 generates an interaction volume near the outer surface 102 of the insulating layer 104 having a radius, r, smaller than the lateral dimension of the electrical conductor 106, then the capacitance, $C_0$, is given by:

$$C_0 = \frac{\pi r^2 k_s \epsilon_0}{d}$$

where $k_s$ is a material constant specific to the insulating layer 104, $\epsilon_0$ is a free-space dielectric constant and d is the thickness of the insulating layer 104. In the above equation for the current signal, I, the rate of change, $\partial V/\partial t$, of the electrical potential with time can include contributions due to scanning of the electron beam 16 and/or varying the electron beam energy with time (e.g. between a pair of scans across the outer surface 102 of the circuit 100).

The magnitude of the capacitively-coupled electrical signal can also depend on the type of circuit 100 being tested and the thickness of the insulating layer(s) 104 overlying the electrical conductor(s) 106. For a relatively thick (e.g. $d \geq 10$ µm) insulating layer 104, the capacitance, $C_0$, can be small so that a large rate of change, $\partial V/\partial t$, of the electrical potential with time can be used to produce a measurable electrical signal. Alternately, if an insulating layer 104 is relatively thin (e.g. a few microns or less) the capacitance, $C_0$, will be larger so that a smaller rate of change, $\partial V/\partial t$, of the electrical potential with time can be used, or else an amplification of the electrical signal can be reduced while retaining a predetermined scan rate of the electron beam 16. Thus, depending upon particulars of the circuit 100 to be tested, a scan rate of the electron beam may be adjusted to provide a measurable electrical signal for identifying and mapping the conduction state of one or more electrical conductors 106.

The capacitive charge generation method of the present invention is also applicable when the electron beam energy is above $E_2$. Above $E_2$, a penetration depth of the electron beam is sufficiently deep that electrons scattered at the bottom of an interaction volume in the insulating layer 104 do not have enough energy to reach the outer surface 102, thereby producing a negative charging of the outer surface 102. However, the negative charging can vary spatially across the outer surface 102 and can be time variant. This occurs due to a perceptible delay or response time before secondary electron emission occurs when the outer surface 102 is irradiated by the electron beam 16. As the electron beam 16 is scanned over the outer surface 102 to irradiate a particular portion thereof secondary electrons continue to be emitted after the electron beam 16 leaves that portion, thereby changing both the accumulated negative charge and the negative electrical potential. Additionally, the magnitude of the surface charge and electrical potential can be affected by the spatial profile of the incident electron beam 16. These effects can produce variations of the surface charge and electrical potential with time, which in turn can produce a capacitively-coupled electrical signal to an electrical conductor 106 buried below the insulating layer 104. In general, an electron beam 16 having an energy greater than $E_2$ produces a larger electrical signal in a buried electrical conductor 106 than is produced for an energy less than $E_2$. In practice, however, the use of an electron beam energy less than $E_2$ is preferable to reduce a possibility for producing a carbon contamination of the outer surface 102 from residual impurities in the high-vacuum chamber 24, especially when the electrical signal can be measured with an acceptable signal-to-noise level or when one or more circuits 100 are to be used after testing (e.g. for qualification testing).

In some embodiments of the present invention, the electron beam energy can be changed between scans of the electron beam over the outer surface 102 of the circuit 100 being tested. This is advantageous for further increasing the rate of change, $\partial V/\partial t$, of the electrical potential with time, thereby increasing the magnitude of the capacitively-coupled electrical signal by as much as two orders of magnitude. Similar results can be achieved when the electron beam energy is varied between two values of energy both above $E_2$, or when one energy value is above $E_2$ and the other energy value is below $E_2$. This effect is not observed, however, if the two values of the electron beam energy are both below $E_2$.

In FIG. 1, current or voltage measuring circuitry 18 is connected to the electrical conductor 106 for measuring the electrical signal generated in response to the ac electrical potential. The measuring circuitry 18 can include a digital tester or a switch matrix 34 connected to the circuit 100 by one or more electrical connections 26. The switch matrix 34 provides a means for measuring or testing a plurality of electrical conductors 106 in a circuit 100 by selecting particular combinations of the electrical conductors 106 to be connected to a measurement unit 36. The measurement unit 36 includes either an ammeter or the like for measuring a current signal generated within the electrical conductor 106 by the incident electron beam 16; or a voltmeter or the like for measuring a voltage signal generated in the conductor 106. The measurement unit 36 can further include a current or voltage amplifier (e.g. a gain-selectable amplifier) for amplifying a small electrical signal generated in the electrical conductor 106 by the electron beam 16.

In FIG. 1 the measuring circuitry 18 can also include a control unit 38 having a computer or the like therein for controlling the switch matrix 34, and for receiving conduction state information or data from the measurement unit 36 for analysis, display or storage. For some embodiments of the present invention, the control unit 38 can further include circuitry for controlling and adjusting parameters of the electron beam 16 (e.g. the electron beam energy and current), and additional circuitry for providing one or more outputs to the electron beam scanner 20 (e.g. electrostatic deflection plates or magnetostatic deflection coils) for raster scanning the electron beam over a predetermined portion of the circuit 100. In these embodiments, a position signal corresponding to the location of the electron beam at any instant of time can be provided by the control unit 38 (or alternately by the electron beam scanner 20) for correlation with the conduction state data to identify and map any open-circuits or short-circuits within the circuit 100, or to verify a continuity state of one or more electrical conductors 106. A monitor or display 40 can also be provided for displaying an image or map of the conduction states of the circuit 100 either with or without a topographic image of the circuit 100 provided by the secondary electron detector 22 superposed therewith for registration.

The electron beam apparatus 10 of the present invention can be further understood with the aid of several examples as presented hereinafter.

EXAMPLE 1

Figure 4:
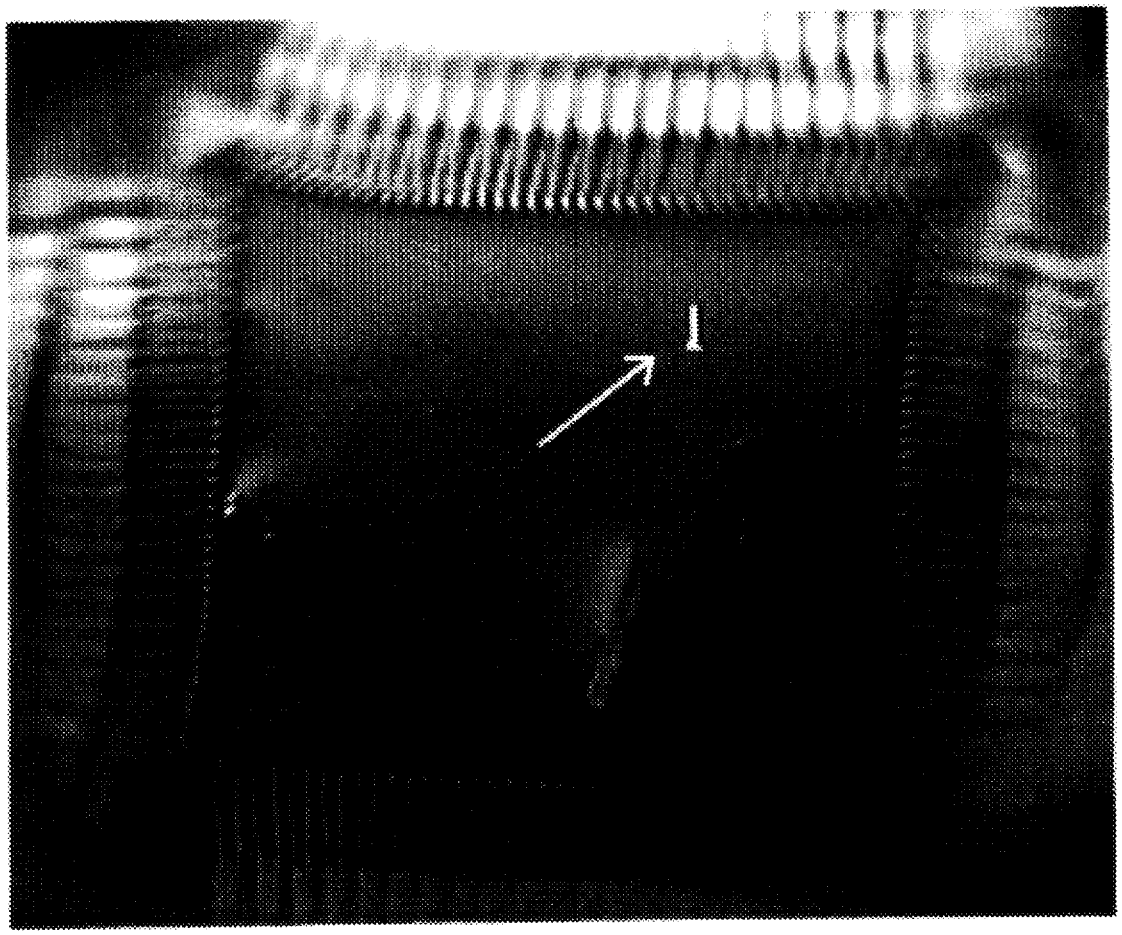
FIG. 4 shows an image of an integrated circuit (IC) produced by the electron beam apparatus 10 of the present invention with an open-circuit electrical conductor therein identified while biasing the IC.

FIG. 4 shows an image of an integrated circuit (IC) 100 produced by the electron beam apparatus 10 of the present invention with an open-circuit electrical conductor 106 therein identified while biasing the IC. In this example, the IC 100 includes three patterned metallization layers forming the electrical conductors 106, with each metallization layer being separated by a 1-μm-thick silicon nitride ($Si_3N_4$) interlevel dielectric layer 104 and the last-formed metallization layer being overcoated with a 1-μm-thick silicon nitride passivation layer 104. The IC 100 further includes another insulating layer 104 comprising about 10 μm of polyimide formed over the silicon nitride passivation layer to encapsulate the IC 100.

To test the IC 100 of FIG. 4 for any open-circuit electrical conductors 106 therein, the electron beam current was set at about 200 nA, with the electron beam energy being about 1,000 eV. The electron beam was raster scanned over the IC 100 at a rate of 12 seconds per frame or image, with the control unit 38 providing the display 40 with an image of the open-circuit electrical conductor 106 (shown as a white pattern in FIG. 4 marked by an arrow) in registration with a secondary electron topographic image of the IC (the topographic image is distorted by use of a low magnification). In FIG. 4, the open-circuit electrical conductor 106 located and mapped by the apparatus 10 was determined to be due to an open-circuit connection between an electrical conductor 106 in a metal-1 layer (i.e. a first-formed metallization layer of the IC) and an electrical via extending through an overlying dielectric layer 104 to a metal-2 layer (i.e. a second-formed metallization layer in the IC).

EXAMPLE 2

Figure 5:
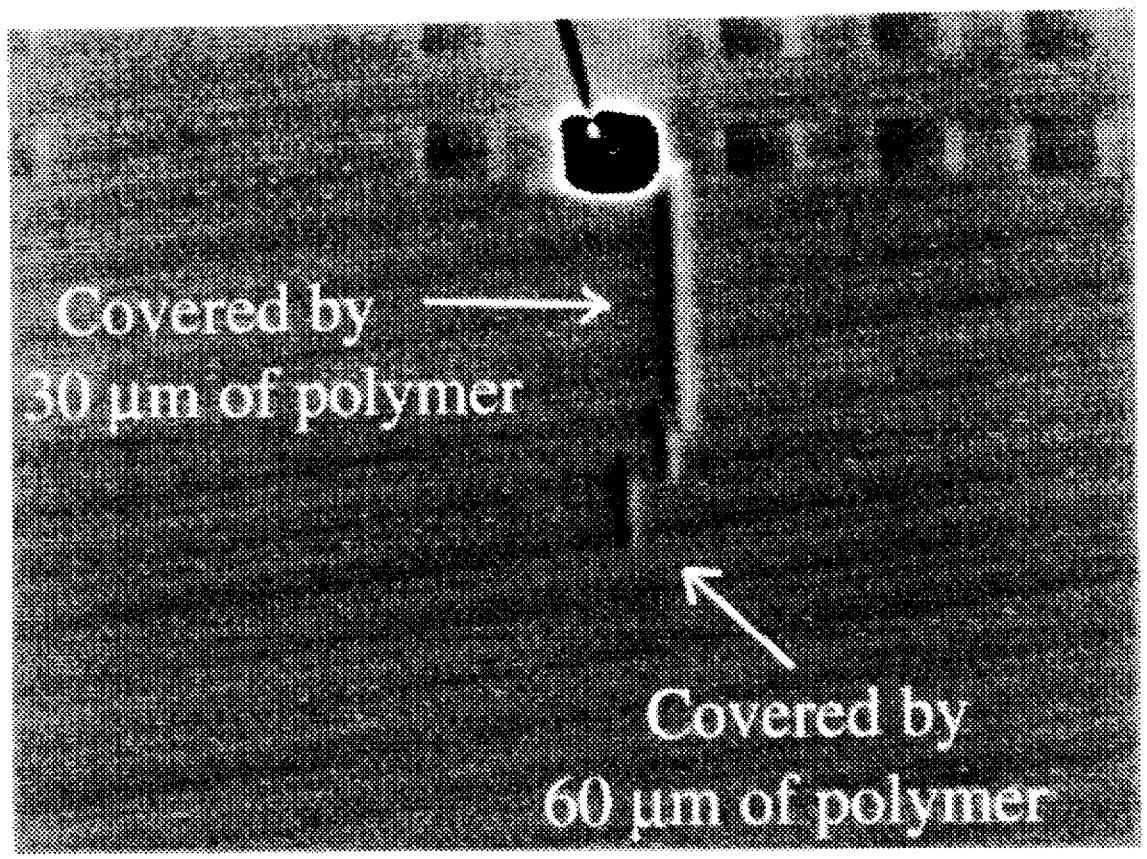
FIG. 5 shows an image of a portion of a multi-chip module (MCM) circuit obtained with the electron beam apparatus of the present invention without any applied electrical bias.

FIG. 5 shows an image of a portion of a multi-chip module (MCM) circuit 100 obtained with the electron beam apparatus 10 of the present invention without any electrical bias being applied thereto. In the example of FIG. 5, an electrical connection 26 is made to one of a plurality of exposed bond pads (indicated as dark squares at the top of FIG. 5) of the MCM 100 in order to image and map the conduction state of an electrical conductor 106 connected to that bond pad and extending outward therefrom underneath a first 30-μm-thick polymer insulating layer 104 (as indicated by the label in FIG. 5). At a distance from the bond pad, the electrical conductor then extends downward through an electrical via and continues below a second 30-μm-thick polymer insulating layer 104'. Thus, in the MCM circuit 100 of this example, portions of the electrical conductor 106 are buried beneath either a 30 μm thickness of polymer or a 60 μm thickness of polymer as indicated by the labels in FIG. 5.

To image or map the conduction state of the electrical conductor 106 in FIG. 5, the electron beam 16 was scanned over a 7 mm×9 mm portion of the MCM 100 at a scan rate of 12 seconds per frame (i.e. 12 seconds to scan over the imaged portion of the MCM 100 in FIG. 5), with the electron beam 16 having a low energy of about 300 eV (i.e. below $E_2$ which is about 1,000 eV for this polymer dielectric material) and a current of about 200 nA. At this low energy, the electron beam 16 penetrates only about 6 nm below the outer surface 102 of the first polymer layer 104. The capacitively-coupled electrical current signal generated in the imaged electrical conductor 106 was amplified with a current amplifier ($10^9$ gain) in the measurement unit 36 and displayed in registration with a secondary electron image of the MCM 100.

In FIG. 5, the bond pad and the electrical connection 26 thereto produce a strong contrast due to a direct injection of electrons from the beam 16. The electrical signal induced in the buried electrical conductor 106 by capacitive coupling of the ac electrical potential produced by the incident electron beam 16 has less contrast, but is sufficiently visible to identify and map the conduction state of the electrical conductor 106. In this case, the electrical conductor 106 has a conduction state that is continuous (i.e. a continuity state) without any open-circuits or closed-circuits therein, thereby verifying the integrity or continuity of the electrical conductor 106. Although only a portion of the MCM circuit 100 is imaged in FIG. 5, the electron beam apparatus 10 is capable of imaging MCM circuits 100 having diagonal dimensions of up to 70 mm while providing a working distance of 80 mm.

EXAMPLE 3

Figure 6A:
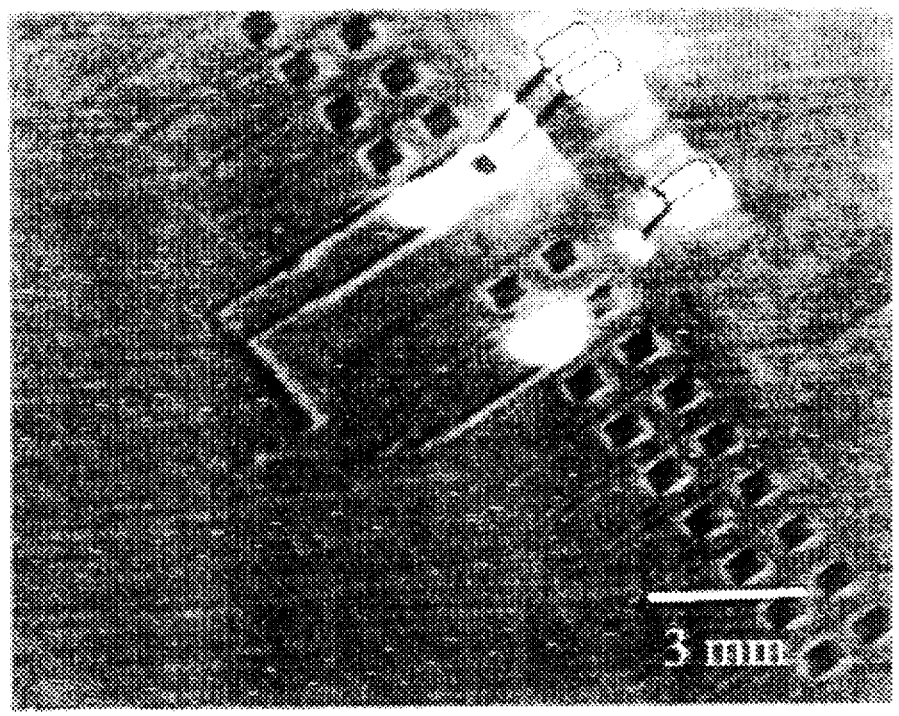
FIGS. 6a and 6b how other images of a portion of the MCM circuit of FIG. 5 obtained with the electron beam apparatus 10 of the present invention.
Figure 6B:
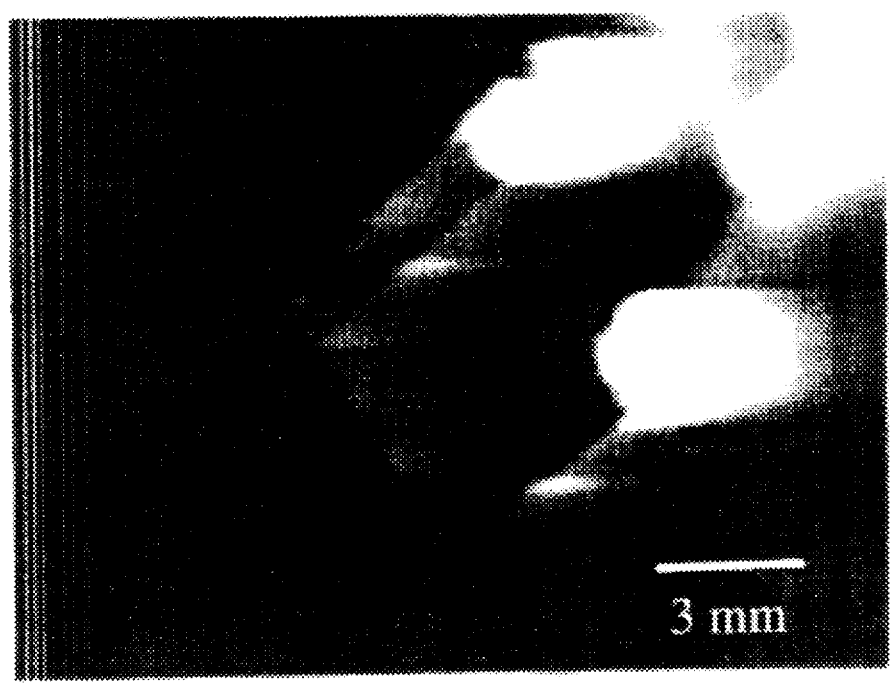

FIGS. 6a and 6b show other images of a portion of the MCM circuit 100 of FIG. 5 obtained with the electron beam apparatus 10 of the present invention. In FIG. 6a (shown to provide a reference for FIG. 6b), the image magnification is reduced from that of FIG. 5 and electrical connections 26 are provided to two additional contact pads for identifying and imaging the continuity of electrical conductors 106 connected thereto. In FIG. 6a, the electron beam energy is 300 eV; the electron beam current is about 200 nA; the amplifier gain is $10^9$; and the scan rate is 12 seconds per frame.

FIG. 6b the electrical conductors 106 of FIG. 6a are imaged at a much faster scan rate of 30 frames per second (i.e. a television or video scan rate). This is achieved by initially scanning the MCM circuit 100 with an electron beam energy of 1,600 eV, and then scanning the MCM with an electron beam energy of 1,700 eV immediately prior to recording the image of FIG. 6b. (No secondary electron image of the MCM circuit 100 is provided in FIG. 6b.) Increasing the scan rate to 30 frames per second and changing the electron beam energy immediately before recording the image both act to increase the rate of change, $\partial V/\partial t$, of the electrical potential with time. As a result, the capacitively-coupled electrical signal is increased in strength by about two orders of magnitude, allowing the amplifier gain to be reduced to $10^7$. It should also be noted that a polarity of the electrical signal is reversed in going from FIG. 6a which is recorded at an electron beam energy below $E_2$ to FIG. 6b which is recorded at an electron beam energy above $E_2$ (i.e. in FIG. 6a, the electrical conductors appear as dark or black lines; whereas in FIG. 6b, the conductors appear as light or white lines).

EXAMPLE 4

The electron beam apparatus 10 of the present invention has also been applied to identifying and mapping conduction states of printed circuit wiring in rigid printed circuit boards (e.g. comprising a dielectric material including an epoxy resin or the like) and flexible printed circuits. At an electron beam energy of 300 eV and an electron beam current of about 200 nA, it was possible to test electrical conductors 106 in the form of printed circuit wiring buried below a total insulating layer thickness of up to about b 125µm, and to identify and map one or more conduction states thereof.

The matter set forth in the foregoing description and accompanying drawings is offered by way of illustration only and not as a limitation. Other applications and variations of the electron beam apparatus and method will become evident to those skilled in the art. The actual scope of the invention is intended to be defined in the following claims when viewed in their proper perspective based on the prior art.

What is claimed is:

1. An electron beam apparatus for testing a circuit to determine a conduction state of at least one electrical conductor therein, comprising:
   a) an electron beam incident on an outer surface of an insulating layer overlying the electrical conductor resulting in an electrical potential thereon; and
   b) a measurement unit connected to the electrical conductor adapted to measure an electrical signal capacitively coupled from the outer surface to the electrical conductor in response to the electrical potential.

2. The electron beam apparatus of claim 1 wherein the electrical potential is an alternating current electrical potential.

3. The apparatus of claim 1 wherein the electron beam has an energy sufficiently low to prevent electrical breakdown of the insulating layer.

4. The apparatus of claim 1 wherein the electron beam has a beam current of at least 25 nanoamperes.

5. The apparatus of claim 1 further including means for scanning the electron beam over the outer surface of the insulating layer, and a position signal indicating the location of the electron beam at any instant of time.

6. The apparatus of claim 5 wherein the electron beam energy is time variant between a first scan over the outer surface of the insulating layer and a second scan over the outer surface.

7. The apparatus of claim 5 wherein the position signal and the electrical signal are used to form a map of the conduction state of the electrical conductor.

8. The apparatus of claim 7 further including a secondary electron detector for providing a secondary electron image of the circuit for registration with the map of the conduction state of the electrical conductor.

9. The apparatus of claim 1 further including a switch matrix for controlling a plurality of electrical connections between the circuit and the measurement unit.

10. The apparatus of claim 1 wherein the conduction state is selected from the group consisting of an open-circuit state, a short-circuit state, and a continuity state.

11. The apparatus of claim 1 wherein the insulating layer comprises a dielectric material selected from the group consisting of silicon dioxide, silicon nitride, glass, polymer, resin, ceramic and combinations thereof.

12. The apparatus of claim 1 wherein the circuit is selected from the group consisting of an integrated circuit, a multi-chip module, a printed circuit board, a flexible printed circuit, and combinations thereof.

13. The apparatus of claim 12 wherein the circuit is an integrated circuit and the insulating dielectric layer comprises, at least in part, a wall of a package containing the integrated circuit.

14. The apparatus of claim 1 wherein the electrical conductor is unbiased.

15. A method for testing a circuit using the apparatus of claim 1.

16. An electron beam apparatus for testing a circuit to determine a conduction state of at least one electrical conductor therein, comprising:
   a) a stage for holding the circuit and making at least one electrical connection thereto;
   b) means for providing an electron beam incident on an outer surface of an insulating layer of the circuit adjacent to the electrical conductor;
   c) means for scanning the electron beam over the outer surface of the insulating layer and generating an alternating current electrical potential on the outer surface of the insulating layer; and
   d) means connected to the stage for measuring an electrical signal capacitively coupled to the electrical conductor in response to the electrical potential, thereby determining the conduction state.

17. The apparatus of claim 16 wherein the electron beam has an energy sufficiently low to prevent electrical breakdown of the insulating layer.

18. The apparatus of claim 16 wherein the electron beam has an energy in the range of about 100 to about 5,000 electron volts, and a beam current of at least 25 nanoamperes.

19. The apparatus of claim 16 further comprising a secondary electron detector for forming a secondary electron image of the circuit for registration with a map of the conduction state.

20. The apparatus of claim 16 further comprising a switch matrix for controlling each electrical connection to the circuit.

21. The apparatus of claim 16 wherein the conduction state is selected from the group consisting of an open-circuit state, a short-circuit state and a continuity state.

22. The apparatus of claim 16 wherein the circuit is selected from the group consisting of an integrated circuit, a multi-chip module, a printed circuit board, a flexible printed circuit, and combinations thereof.

23. An electron beam apparatus for identifying and mapping a conduction state of at least one electrical conductor within a circuit, comprising:

a) a stage for holding the circuit and making at least one electrical connection thereto;

b) means for providing an electron beam incident on an outer surface of an insulating layer of the circuit adjacent to the electrical conductor;

c) means for scanning the electron beam over the outer surface of the insulating layer and generating an electrical potential on the outer surface of the insulating layer; and d) means connected to the stage for measuring an electrical signal capacitively coupled to the electrical conductor in response to the electrical potential.

24. The apparatus of claim 23 wherein the electron beam has an energy sufficiently low to prevent electrical breakdown of the insulating layer.

25. The apparatus of claim 23 wherein the insulating layer comprises a dielectric material selected from the group consisting of silicon dioxide, silicon nitride, glass, polymer, resin, ceramic, and combinations thereof.

26. The apparatus of claim 23 wherein the circuit is selected from the group consisting of an integrated circuit, a multi-chip module, a printed circuit board, a flexible printed circuit, and combinations thereof.

27. The apparatus of claim 26 wherein the circuit is an integrated circuit and the insulating dielectric layer comprises, at least in part, a wall of a package containing the integrated circuit.

28. The apparatus of claim 23 wherein the at least one electrical conductor is unbiased.

* * * * *